United States Patent
Kempers et al.

(10) Patent No.: US 11,032,942 B2
(45) Date of Patent: Jun. 8, 2021

(54) STRUCTURE FOR A HEAT TRANSFER INTERFACE AND METHOD OF MANUFACTURING THE SAME

(71) Applicant: ALCATEL-LUCENT, Boulogne-billancourt (FR)

(72) Inventors: Roger Scott Kempers, Toronto (CA); Paul Ahern, Clonee (IE); Alan Michael Lyons, New Providence, NJ (US); Anthony Robinson, Laytown (IE)

(73) Assignee: Alcatel Lucent, Nozay (FR)

( * ) Notice: Subject to any disclaimer, the term of this patent is extended or adjusted under 35 U.S.C. 154(b) by 0 days.

(21) Appl. No.: 14/917,595

(22) PCT Filed: Sep. 25, 2014

(86) PCT No.: PCT/IB2014/002115
§ 371 (c)(1),
(2) Date: Mar. 9, 2016

(87) PCT Pub. No.: WO2015/044773
PCT Pub. Date: Apr. 2, 2015

(65) Prior Publication Data
US 2016/0219751 A1 Jul. 28, 2016

(30) Foreign Application Priority Data
Sep. 27, 2013 (EP) ..................................... 13306340

(51) Int. Cl.
*H05K 7/20* (2006.01)
*B21D 13/02* (2006.01)
(Continued)

(52) U.S. Cl.
CPC ........... *H05K 7/2039* (2013.01); *B21D 13/02* (2013.01); *B21D 33/00* (2013.01); *B21D 53/04* (2013.01);
(Continued)

(58) Field of Classification Search
None
See application file for complete search history.

(56) References Cited

U.S. PATENT DOCUMENTS 3,881,799 A * 5/1975 Elliott ...................... H01R 4/26
174/253
5,172,473 A * 12/1992 Burns ..................... H01L 23/32
29/885
(Continued)

FOREIGN PATENT DOCUMENTS

| | | |
|---|---|---|
| CN | 102446880 A | 5/2012 |
| EP | 1901350 A1 | 3/2003 |

(Continued)

OTHER PUBLICATIONS

PCT International Search Report/Written Opinion dated Jan. 27, 2010 (PCT/US2009/003651) 11 pages.
(Continued)

*Primary Examiner* — Courtney L Smith
(74) *Attorney, Agent, or Firm* — Nokia Technologies Oy

(57) ABSTRACT

A heat transfer interface structure and a method of manufacturing the same are disclosed. A substrate has a plurality of raised features formed on at least one surface the substrate. The raised features are deformable under a compressive force and have respective openings at end portions thereof. A thickness of a raised feature at the end portion thereof is smaller than a thickness of the raised feature at an intermediate portion of the raised feature.

7 Claims, 8 Drawing Sheets

(51) Int. Cl.
  *B21D 53/04* (2006.01)
  *B21D 33/00* (2006.01)
  *H01L 23/433* (2006.01)
  *H01L 23/42* (2006.01)
  *H01L 23/373* (2006.01)
  *H01L 21/48* (2006.01)
  *H01L 23/367* (2006.01)
  *F28F 13/00* (2006.01)

(52) U.S. Cl.
  CPC ........ *H01L 21/4878* (2013.01); *H01L 23/367* (2013.01); *H01L 23/3735* (2013.01); *H01L 23/42* (2013.01); *H01L 23/433* (2013.01); *F28F 2013/006* (2013.01); *H01L 2924/0002* (2013.01)

(56) References Cited

U.S. PATENT DOCUMENTS

| | | | |
|---|---|---|---|
| 5,542,176 | A | 8/1996 | Serizawa et al. |
| 6,011,694 | A | 1/2000 | Hirakawa |
| 6,245,186 | B1 | 6/2001 | Alcoe et al. |
| 6,255,139 | B1* | 7/2001 | Edwards ............... H01L 23/367 |
| | | | 156/276 |
| 6,279,227 | B1 | 8/2001 | Khandros et al. |
| 6,365,500 | B1 | 4/2002 | Chang et al. |
| 6,374,490 | B1 | 4/2002 | Miyahara |
| 6,462,952 | B1 | 10/2002 | Ubukata et al. |
| 7,005,751 | B2 | 2/2006 | Khandros et al. |
| 7,294,919 | B2 | 11/2007 | Bal |
| 8,289,712 | B2* | 10/2012 | Holahan ............... H01L 23/433 |
| | | | 361/709 |
| 8,318,613 | B2* | 11/2012 | Stockum ................. C23C 18/12 |
| | | | 257/E21.271 |
| 2001/0006258 | A1 | 7/2001 | Hur |
| 2002/0056922 | A1 | 5/2002 | Funaya et al. |
| 2002/0141155 | A1 | 10/2002 | Pinneo |
| 2003/0025202 | A1 | 2/2003 | Mikagi et al. |
| 2003/0052156 | A1* | 3/2003 | Kim ..................... B23K 1/0008 |
| | | | 228/180.22 |
| 2003/0113578 | A1* | 6/2003 | Omachi ............... H01L 23/3733 |
| | | | 428/687 |
| 2003/0116312 | A1 | 6/2003 | Krassowski et al. |
| 2003/0205363 | A1 | 11/2003 | Chu et al. |
| 2004/0099944 | A1* | 5/2004 | Kimura ............... H01L 23/4334 |
| | | | 257/706 |
| 2005/0017350 | A1* | 1/2005 | Corti .................... H01L 23/3672 |
| | | | 257/706 |
| 2005/0195574 | A1 | 9/2005 | Chiba et al. |
| 2006/0160373 | A1* | 7/2006 | Kowalski .......... H01L 21/31053 |
| | | | 438/778 |
| 2007/0131396 | A1 | 6/2007 | Yu et al. |
| 2007/0267735 | A1* | 11/2007 | Awano ................ H01L 21/6835 |
| | | | 257/692 |
| 2008/0290504 | A1* | 11/2008 | Karavakis ........... H01L 23/3737 |
| | | | 257/713 |
| 2009/0014205 | A1 | 1/2009 | Kobayashi et al. |
| 2009/0126903 | A1* | 5/2009 | Kuibira .............. H05K 7/20963 |
| | | | 165/67 |
| 2009/0205394 | A1* | 8/2009 | Luckey, Jr. .......... B21D 26/055 |
| | | | 72/379.2 |
| 2009/0291531 | A1* | 11/2009 | Sato .................... H01L 21/4878 |
| | | | 438/126 |
| 2011/0165733 | A1 | 7/2011 | Haba et al. |
| 2012/0080799 | A1 | 4/2012 | Hohlfeld et al. |
| 2012/0180910 | A1* | 7/2012 | Thomas ................. C21D 1/673 |
| | | | 148/531 |
| 2016/0193703 | A1 | 7/2016 | Kempers et al. |

FOREIGN PATENT DOCUMENTS

| | | |
|---|---|---|
| JP | S63100759 A | 5/1988 |
| JP | S6476742 A | 3/1989 |
| JP | 7161881 A | 6/1995 |
| JP | H0888300 A | 4/1996 |
| JP | H10513611 A | 12/1998 |
| JP | 200317542 A | 11/2000 |
| JP | 2001345405 A | 12/2001 |
| JP | 2002033429 A | 1/2002 |
| JP | 2002198473 A | 7/2002 |
| JP | 2001345405 A | 4/2003 |
| JP | 2002198473 A | 2/2004 |
| JP | 2006024720 A | 1/2006 |
| JP | 2006134989 A | 5/2006 |
| JP | 2007294554 A | 11/2007 |
| WO | 02100145 A1 | 12/2002 |

OTHER PUBLICATIONS

Foreign Communication related to a counterpart application, JP Application No. 2011-514616, Japanese Office Action dated Jul. 31, 2014, 6 pages.

Foreign Communication from a related counterpart application, European Application No. 13306340.4, European Search Report dated Feb. 25, 2014, 6 pages.

\* cited by examiner

STRUCTURE FOR A HEAT TRANSFER INTERFACE AND METHOD OF MANUFACTURING THE SAME

This application claims priority from European Patent Application No. 13306340.4 filed 27 Sep. 2013, and entitled "A structure for a heat transfer interface and method of manufacturing the same", and the International Application No. PCT/IB2014/002115 the contents of both of which are incorporated by reference herein in their entirety.

FIELD OF THE INVENTION

The present disclosure relates to heat transfer devices.

BACKGROUND

Electric and electronic components typically generate heat during operation. In order to reduce the heat, use is often made of a heat dissipating components such as a heat sink which is typically positioned in physical contact with the heat generating component to absorb and dissipate heat from the latter. However when heat is conducted between two components (e.g. an IC and a heat sink) the temperature difference across the interface of the parts may be appreciable. This temperature drop is typically attributed to the thermal contact resistance due to surface roughness effects, as such surface roughness effects give rise to interstitial air voids between the surfaces of the two components being joined together. For mating surfaces that appear relatively smooth and flat, the contact made between these two parts typically occurs at relatively few points. The voids between these points of contact are often filled with some type of fluid—typically air. In this situation, there are two paths for heat transfer, one being thermal conduction through the solid components at their points of contact and the other being thermal conduction through the interfacial layer of air, which is a relatively poor conductor. Similarly, the poor physical contact may also give rise to an excessively high electrical contact resistance which may also be a problem in certain systems where electrical conduction or grounding through contacting joints is important.

As a remedy to improve heat transfer between the two components one known approach is to replace the air with a more conductive thermal interface material (TIM), thereby improving the path for heat transfer between the two components

SUMMARY

Some embodiments feature a thermally conductive heat transfer interface structure comprising a substrate having a first surface and a second surface and a plurality of raised features formed on at least one of the first surface and the second surface of the substrate, the raised features being deformable under a compressive force, wherein some of the raised features have an opening at a respective end portion thereof; and
wherein a thickness of a raised feature at said end portion is smaller than a thickness of the raised feature at an intermediate portion of the raised feature.

According to some specific embodiments, one or more raised features each comprise a first height corresponding to a first location on the end portion thereof and a second height corresponding to a second location on the end portion thereof, wherein a height is a distance from a plane defined by the substrate to a parallel plane passing through a location on end portion.

According to some specific embodiments, a raised feature has a wall and the wall comprises roughness on an outer surface thereof.

Some embodiments feature apparatus comprising an electric component capable of generating heat, a heat dissipater component and a heat transfer interface structure as disclosed herein, said heat transfer interfaced structure being located between the electric component and the dissipater component.

Some embodiments feature a method, comprising:
 placing a deformable sheet of thermally conductive material between two dies each comprising at least one of a projection and a cavity on a respective surface, wherein a projection has a matching shape and dimensions with a cavity;
 moving a die toward the other such that a projection nests within a corresponding opposite cavity and such that a compressive force is applied to the deformable sheet located between the projection and the cavity to produce a raised feature in the deformable sheet, the raised feature having an opening at a respective end portion thereof;
wherein a thickness of a raised feature at said end portion is smaller than a thickness of the raised feature at an intermediate portion of the raised feature.

According to some specific embodiments the method further comprises:
 exerting a force by a projection on the deformable sheet, causing the deformable sheet to undergo a deformation in the proximity of a point of contact between the projection and the deformable sheet, wherein
said deformation is produced by causing a material yield in the deformable sheet at said point of contact to cause the thickness of a raised feature at said end portion become smaller than a thickness of the raised feature at an intermediate portion of the raised feature.

According to some specific embodiments the method further comprises fracturing the deformable sheet to produce an opening in the end portion of the raised feature.

According to some specific embodiments the dies have roughness on the respective outer surface thereof, such roughness being configured to transfer unevenness associated to the roughness thereon to a surface of the raised features as the deformable sheet is deformed.

These and further features and advantages of the present invention are described in more detail, for the purpose of illustration and not limitation, in the following description as well as in the claims with the aid of the accompanying drawings.

These and further features and advantages of the present disclosure are described in more detail, for the purpose of illustration and not limitation, in the following description as well as in the claims with the aid of the accompanying drawings.

DETAILED DESCRIPTION OF EMBODIMENTS

Conventional thermal interface materials (TIMs) are often composites of thermally conductive particles dispersed in a thermally insulating organic matrix (e.g., adhesive or grease). The thermal conductivity of such composites is limited by the relatively low concentration of particles, as often needed to assure proper viscosity, and by the thermal resistance of particle-particle contacts. Additionally, air-filled voids, which have poor thermal conductivity, can accumulate in the organic matrix, thereby decreasing the overall thermal conductivity of the TIM. Soft metals, such as Indium, or other soft materials, such as graphite, are also sometimes used as thermal interface materials. Although the thermal conductivity of these materials is higher than the composite materials, they have limited ability to comply with non-planar or irregular surfaces. Some of these soft materials are susceptible to corrosion, and, can have low melting points. All of these limitations can restrict reliability, applicability and assembly options.

An approach for addressing the above drawbacks has been described in US20090315173 the content of which is herein incorporated by reference in its entirety. US20090315173 discloses various embodiments for a heat transfer structure comprising deformable raised features with a variety of shapes and configurations which may be used according to the specific requirements of each particular use.

Figure 1:
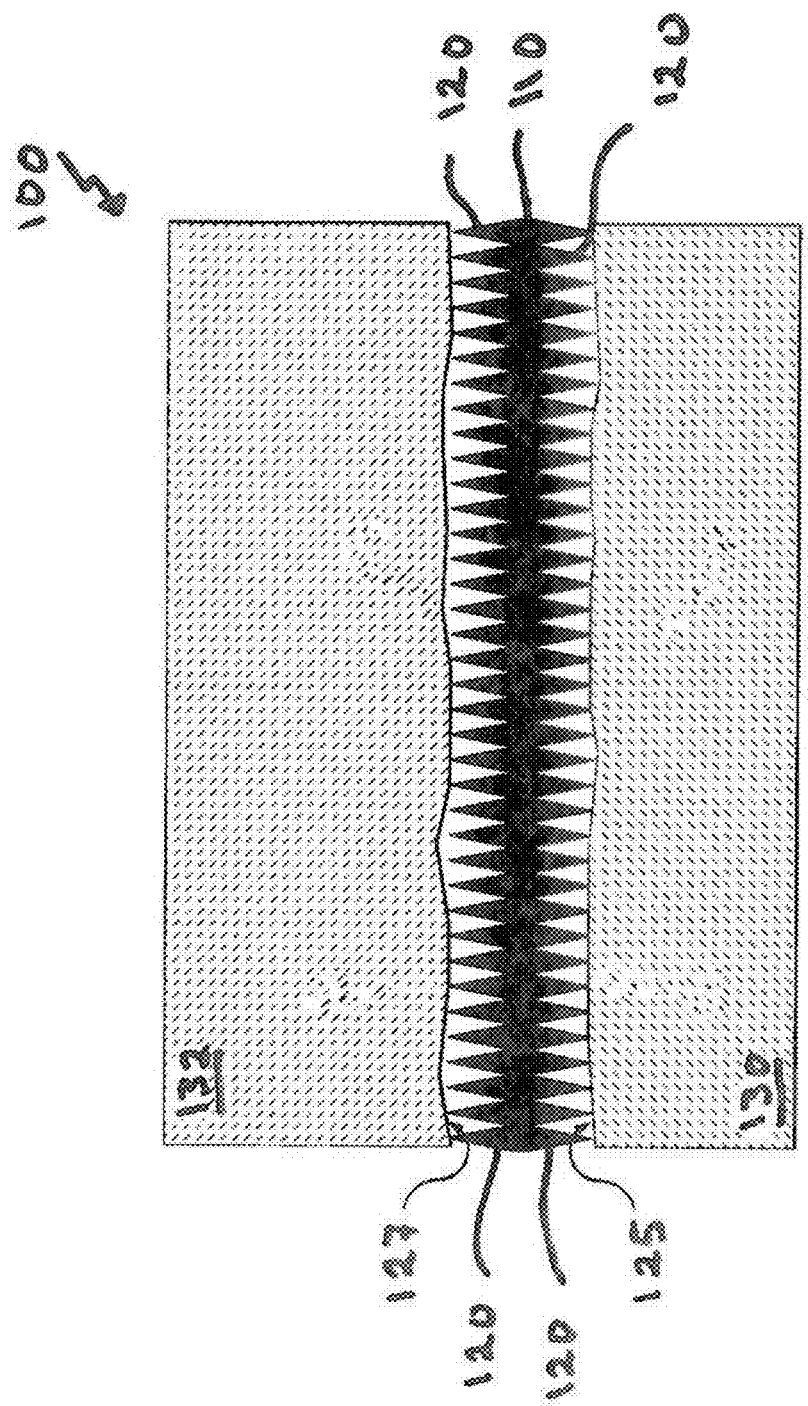
FIG. 1 is a simplified exemplary illustration of a known heat transfer interface structure.

FIG. 1 shows a simplified example of a known interface structure 100. Although the drawing shown in FIG. 1 is similar to an embodiment as disclosed in the above-referenced document, FIG. 1 is only provided for illustration purposes and a better understanding of the present disclosure and is not be construed to necessarily include all the features, limitations and/or variants of embodiments of the referenced US20090315173.

The interface structure 100 of FIG. 1 is intended for use as a heat transfer interface structure between components 130 and 132 having respective interface surfaces 125, 127. The interface surfaces 125, 127 have surface non-uniformities (or irregularities or roughnesses). The structure 100 comprises a substrate 110 having raised features 120. The raised features 120 are designed to physically contact both surfaces 125, 127 regardless of whether the surfaces 125, 127 are coplanar or whether one or both or the surfaces 125, 127 are curved or otherwise non-planar. The raised features 120 may be metallic and deformable and configured to be compressed in at least one dimension as compared to a pre-deformed shape. Compression in the at least one dimension can occur by bending or buckling of the shape of the raised features, or by other modes of changing the shape of the raised features. The direction of compression may be in the direction of arrow A1 or A2 or both.

The raised features 120 may be located, and in some cases formed directly, on one or more surfaces of a substrate. As shown in the example of FIG. 1 the raised features 120 are located on both of the surfaces of a first side and an opposite second side of the planar substrate 100. In some cases, the substrate itself is a deformable metallic substrate.

The present disclosure departs from a configuration similar to the above-mentioned example of FIG. 1 and further provides a structure with additional specific design features and manufacturing techniques as described in further detail below.

Figure 2:
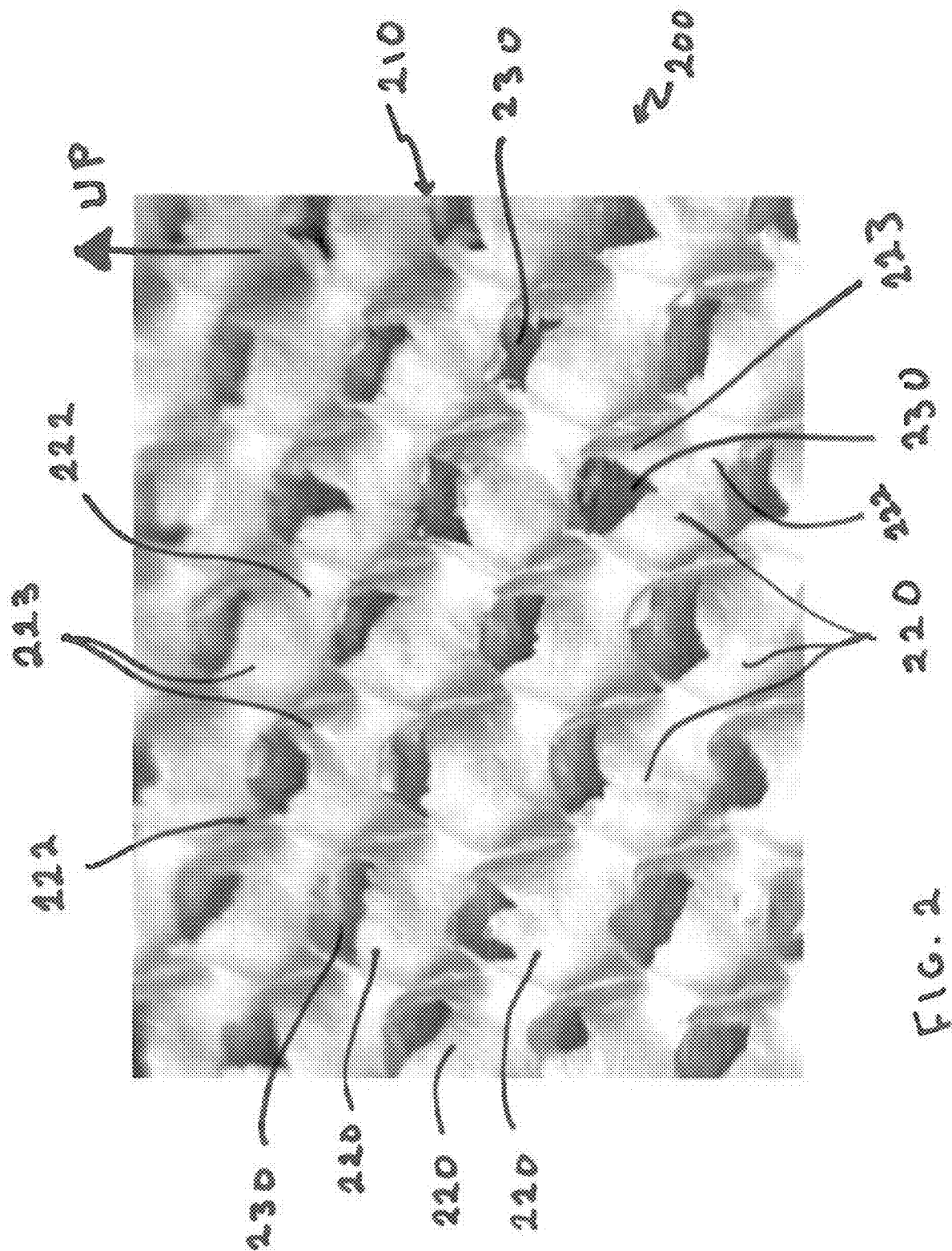
FIG. 2 is an exemplary schematic representation of a heat transfer interface structure according to some embodiments.

FIG. 2 is an exemplary schematic representation of a heat transfer interface structure 200 (herein also referred to as interface structure) according to some embodiments.

In this embodiment, the interface structure 200 comprises a substrate 210 and a plurality of raised features 220. The raised features 220 are preferably hollow and may be located on both of the surfaces of a first side (e.g. upper side of the structure of FIG. 2 shown by arrow UP) and an opposite second side (e.g. lower side of the structure of FIG. 2 which is not visible in the figure), or they may located on only one side thereof. In this regard, the term "raised" is to be understood to refer not only to the features emerging upward from the surface of the substrate 210 but also the features emerging downward therefrom. A raised feature 220 has a base portion 222 which is the portion proximate to the body of the substrate 210 and an end portion 223 opposite to the base portion and being at a certain distance, or at a certain height, from the substrate 210.

Preferably the raised features 220 are provided in the form of a two-dimensional array (e.g. length by width relative to the surface of the substrate 210) comprising a continuous plurality of such raised features.

According to the present disclosure, a raised feature 220 has an opening 230 at the end portion 223 thereof. Preferably the opening is made by truncating the end portion 223 of the raised feature (i.e. the end portion is cut off transversely with respect to the height of the raised feature).

In FIG. 2, the raised features 220 are shown in the form of truncated domes; however other shapes such as, but not limited to, truncated cones or truncated multi-sided pyramids may also be made.

The proposed shape for the raised features provides certain advantages as compared to the shape of the known raised features which do not have such openings incorporated, because it reduces the stiffness of the features thus presenting less resistance to the compression and flow of metal as the entire structure is compressed. Indeed a raised feature with an opining 230 may bend or buckle with a relatively lower pressure needed to be exerted thereupon (as compared to one without such opening).

Raised features 220 with openings 230 may be provided in an array, as shown in FIG. 2, comprising a plurality of such features positioned on the substrate 210 either randomly or periodically or according to any suitable pattern. Such array may significantly reduce the stress required for the material to conform to surface irregularities and thus provide a lower thermal contact resistance compared to known structures of raised features without openings 230.

Figure 3:
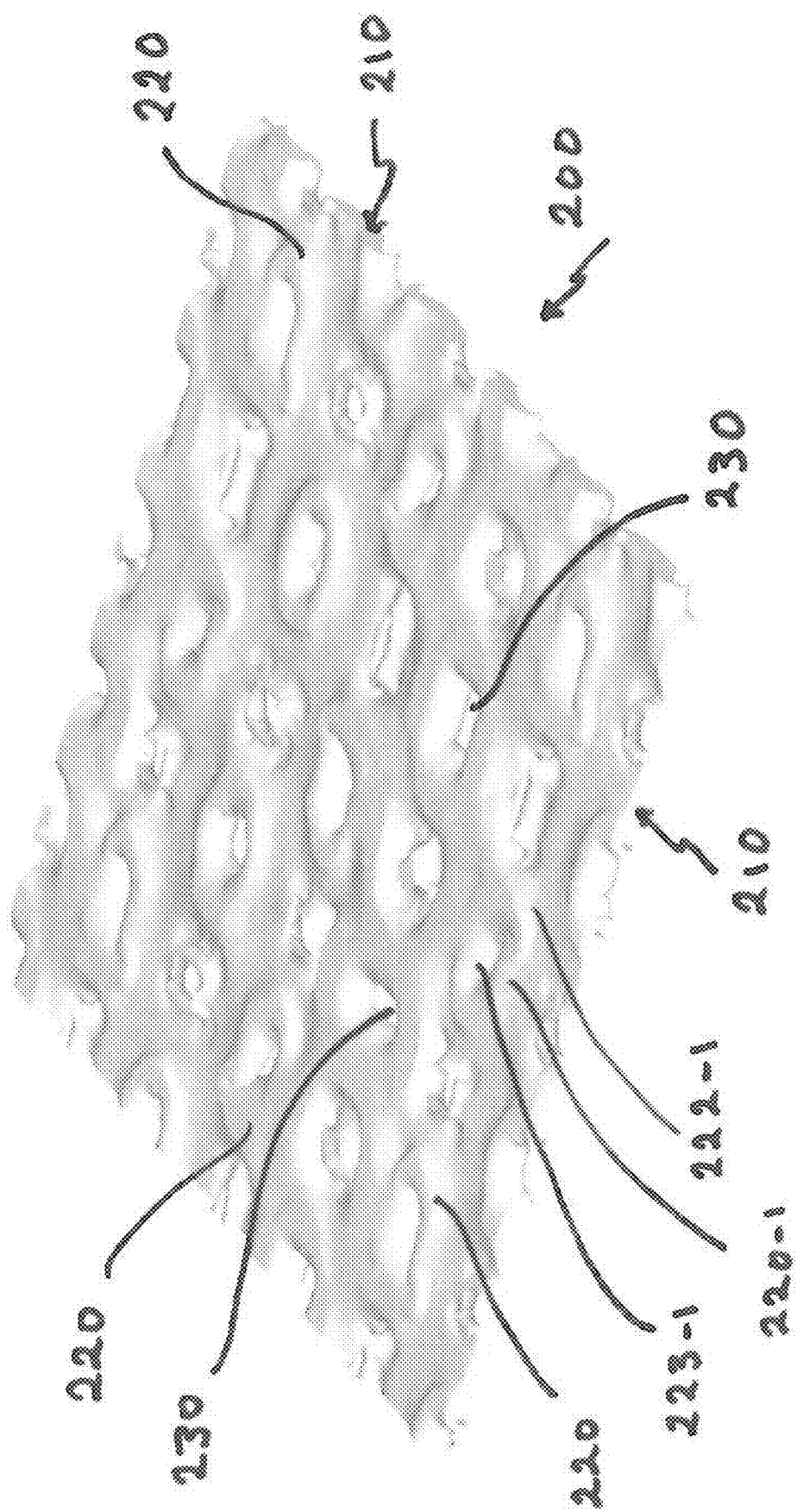
FIG. 3 is an exemplary schematic representation of the heat transfer interface structure of FIG. 2 after compression.

Referring now to FIG. 3 an exemplary schematic representation of the heat transfer interface structure of FIG. 2 is provided after such structure has undergone a compression. In FIG. 3, like elements have been given like reference numerals as those of FIG. 2.

As can be seen in the compressed structure of FIG. 3, the various elements of the structure have undergone deformation. It is readily observable that the raised features have undergone large-scale compressive plastic deformation including bending and buckling modes resulting in relatively more flattened structures that form a continuous path between the assembled bodies, not shown in the figure (e.g. an electronic component and a heat sink). Such flattened structures may include areas that may come in intimate contact with the compressing surfaces.

For example the raised structure 220-1 of figure may be considered in which the end portion 223-1 is shown to have been compressed, e.g. bent or buckled, toward the base portion 222-1 thereby resulting in a relatively more flattened structure as compared to known structures. The openings of the raised features in the present embodiment therefore allow for obtaining a highly effective thermal and electrical path between the mating components.

In a highly effective situation, all the compressed raised features may bend or buckle such that all the openings may close as a result of such compression and the collapse of the raised features on the substrate, thereby occupying the open spaces. However, in many practical cases it may occur that not all the raised features actually close the openings upon compression, thereby leaving some areas on the structure still with openings 230 as shown in FIG. 3. The presence of such openings after compression may be remedied by applying grease or adhesive as will be described further below.

Figure 4A:
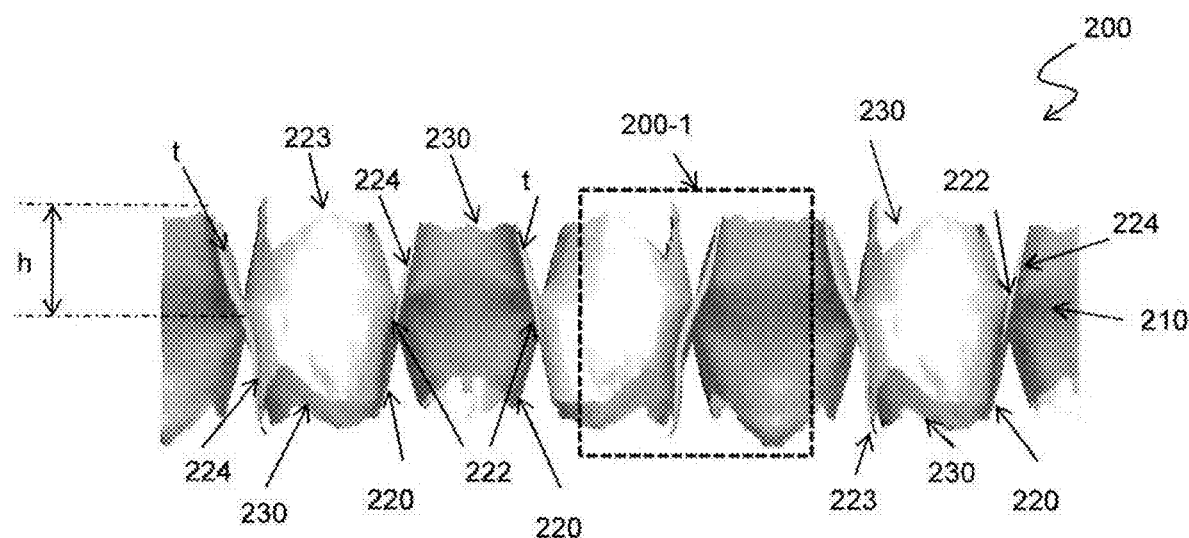
FIG. 4A is a representation of a portion of the heat transfer interface structure of FIG. 2 in a cross sectional view.
Figure 4B:
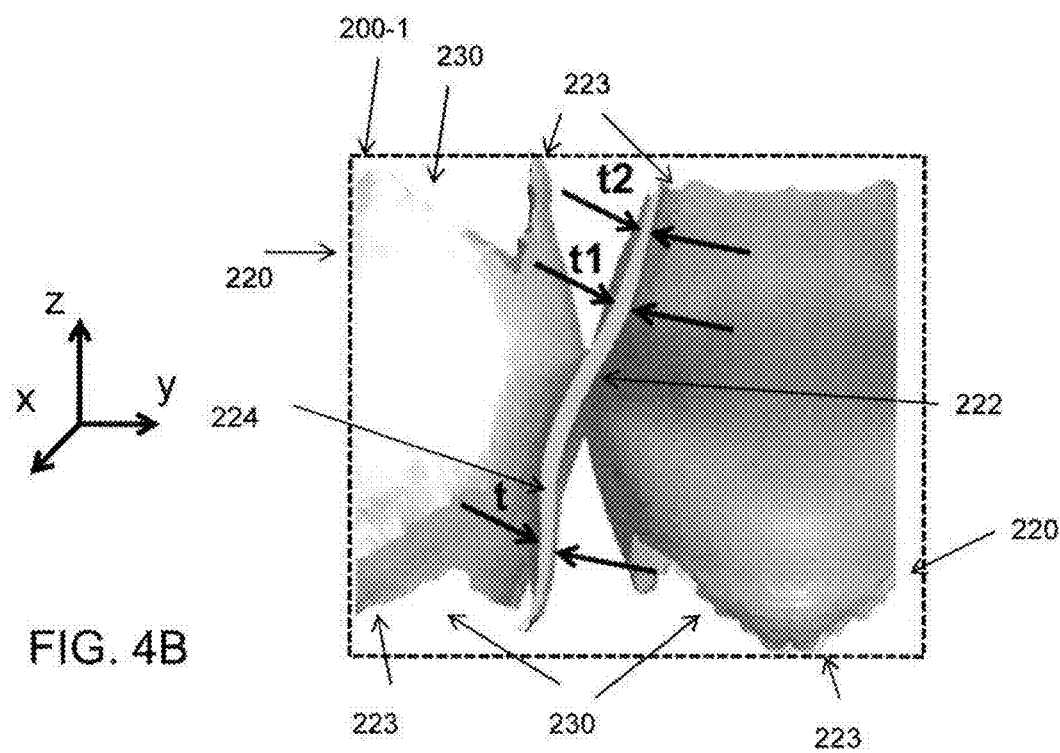
FIG. 4B is a detailed view of a section of the portion shown in FIG. 4A FIGS. 5A, 5B, 5C, 5D and 5E are exemplary schematic representations in a cross sectional view of various instances of a compression operation performed on the heat transfer interface structure of FIG. 2.

FIGS. 4A and 4B represent cross sectional view of a portion of the interface structure of FIG. 2. In particular FIG. 4B illustrates in further detail a portion 200-1 of the structure 200 of FIG. 4A. In these figures like elements have been provided with like reference numerals as those of FIG. 2.

As illustratively shown in FIGS. 4A and 4B, a raised feature 220 has a base portion 222 and an end portion 223. The raised features are in the shape of truncated domes having sides or walls 224, each wall having a thickness t.

However, the thickness of the wall 224 changes as one moves from the base portion 222 to the end portion 223. This is more clearly shown in FIG. 4B where the thickness t1 in proximity to the base portion 222 is shown to be more than the thickness t2 in proximity to the end portion 223.

This specific variation in the thickness of the wall 224 is advantageous from a mechanical standpoint because the thinner end portions would present weaker resistance to compression as compared to the thicker base portion during the initial compression phase giving rise to a more efficient bending or buckling process of the raised features. Non-limiting example of values for the thickness of the wall 224 may range from about 5 to about 500 microns.

In some embodiments, the height of one or more raised features (z direction in FIGS. 4A, 4B) may vary at different locations around the corresponding openings 230 of the raised feature. Herein, the term height may be understood to related to the distance from a plane defined by the substrate 210 (it is understood that the substrate generally defies a plane at the level of the base portions of the raised features) to a parallel plane passing through a point located at the end portion 223 of the raised feature. This height is shown in FIG. 4A by double headed arrow h.

This variation in height may cause one part of the feature at its end portion 223 to make contact before another part of the same feature at that end portion. This can contribute to inducing an overall twisting bending or bucking deformation to the structure itself.

The above feature and its effect during the compression process is more clearly shown in FIGS. 5A to 5E.

Figure 5A:
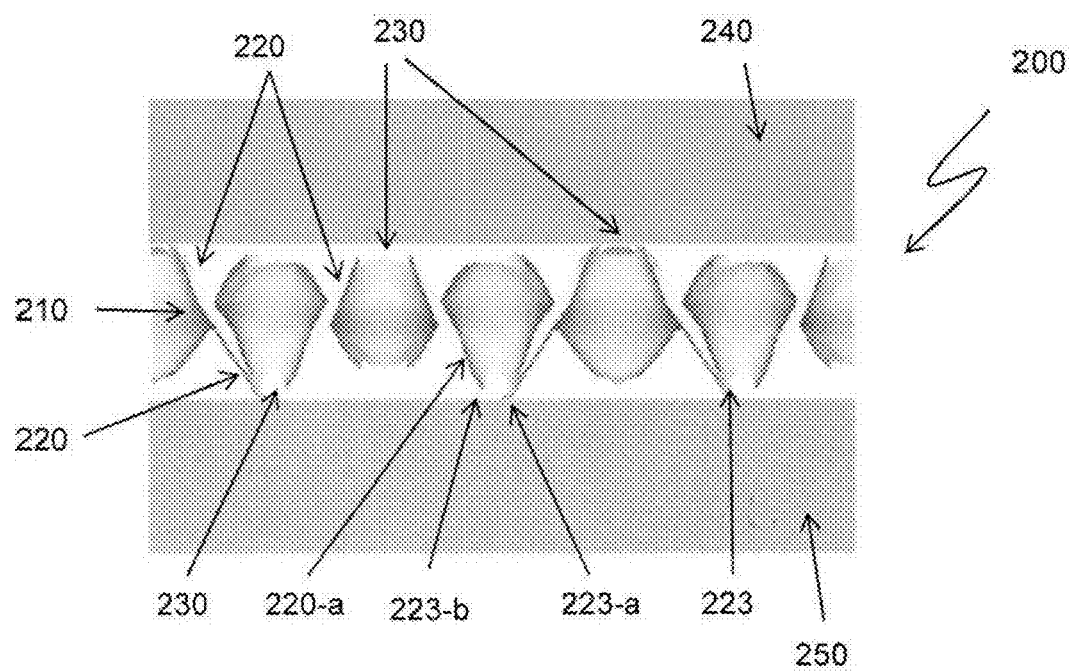
Figure 5B:
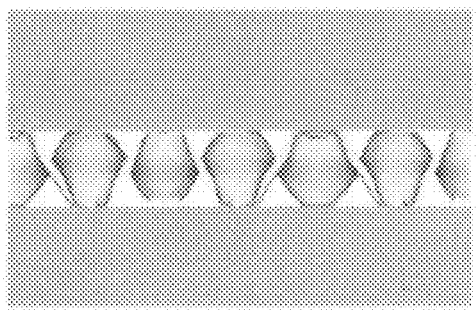
Figure 5C:
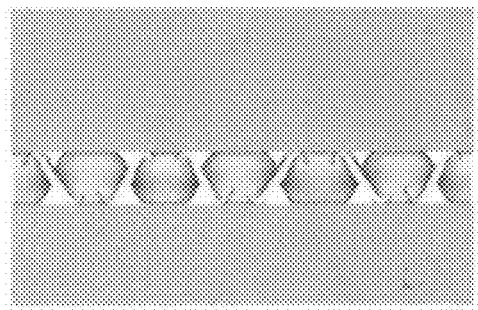
Figure 5D:
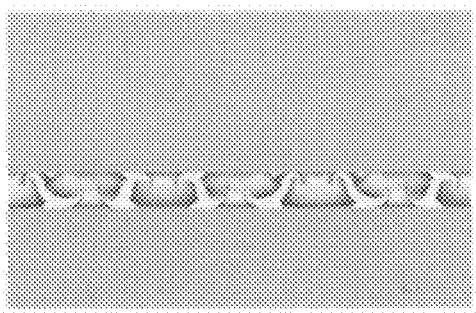
Figure 5E:
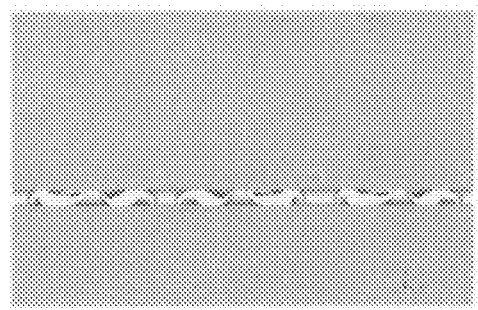

Starting from FIG. 5A, an interface structure 200 is shown to be located between components 240 and 250 which are intended to transfer heat between each other with the structure acting as an interface therebetween. Component 240 may be for example a heat sink and component 250 may be for example an electronic device which heats up during operation and needs to be cooled off.

As already described above, the interface structure 200 comprises raised features 220 extending from both sides (up and down in the figure) of the substrate 210. The raised features have respective openings 230. As can be appreciated in the figure, the raised features may have different heights at their corresponding end portions 223. For example, considering the raised feature 220-a, it may be observed that at a first location 223-a it has a first height and at a second location 223-b it has a second height. As can be appreciated from FIG. 5A, at an initial instance of the compression operation the first location 223-a of the raised feature 220-a enters into contact earlier than the second location 223-b.

FIGS. 5B, 5C, 5D and 5E show subsequent instances of the compression process in which, as it can be observed, the raised features bend or buckle thereby producing the deformed heat interface structure as shown in FIG. 3.

In some embodiments, the walls, e.g. walls 224 in FIGS. 4A and 4B, may comprise roughness on their outer surface in form of bumps, facets, undulations or any other suitable form of unevenness. These roughnesses are formed during the stamping process by having corresponding roughnesses present on the dies as will be described with reference to FIG. 8. These roughnesses further facilitate compression and buckling of the raised features of the heat interface structure.

A method of manufacturing the interface structure according to some embodiments of the disclosure is described below with reference to FIG. 6.

The interface structure may be manufactured starting from a deformable and preferably flat sheet 610, such as a metal foil. The material of the sheet is chosen so as to posses the heat transfer, electrical and chemical characteristics required for the specific design and application.

For the sake of clarity with respect to the use of the term heat transfer characteristics, or said in other words, thermal conductivity, as used herein, the following clarification is provided. As it is known, many materials, and even from a pure theoretical standpoint any material, may be considered to be thermally conductive (thus having heat transfer capabilities) as each material has a certain level of thermal conductivity, even if in some cases such level is very low. However, within the context of the present disclosure, a person skilled in the related art would be able to distinguish a material which is considered in the art as thermally conductive from one which is not so considered, such as for example a thermal insulator.

By way of still further clarification, it is noted that within the context of the present disclosure, any material having a thermal conductivity greater than about 1 W/mK (Watts per Meter Kelvin) may be considered as a thermally conductive material. Conversely, any material having a thermal conductivity of less than about 1 W/mK may be considered as thermally non-conductive. Within the thermal conductivity range described above, a thermal conductivity greater than 100 W/mK may be considered as a high thermal conductivity value and one within the range of 1-100 W/mK may be considered as an acceptable value.

Some examples of such materials are given further below.

Figure 6:
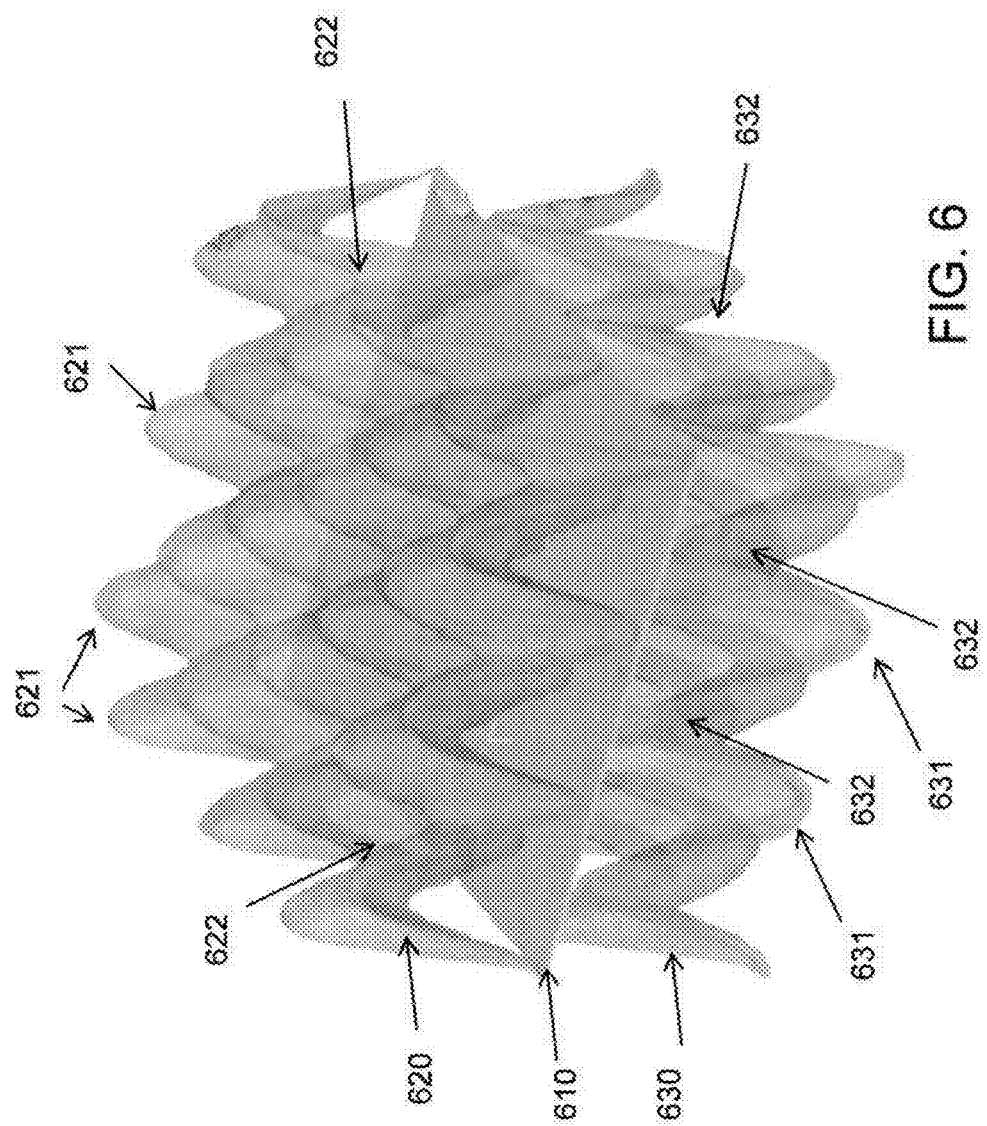
FIG. 6 is an exemplary schematic representation of a heat transfer interface structure located between two dies before compression operation.

The deformable sheet 610 is then placed between two dies 620 and 630 as schematically shown in FIG. 6. The dies 620 and 630 have respective projections 621 and 631 and cavities 622 and 632 provided on their respective surfaces. It is to be noted that while the projections on one die point in one direction (e.g. projections 621 are shown pointing upward in the figure), the projections on the other (opposite) die point in the opposite direction (projections 631 point downward). The dies are then moved toward each other with sufficient force so as to compress and stamp the deformable sheet 610 placed between them.

The projections 621, 631 and the cavities 622, 632 are configured such that a projection has matching shape and dimensions with a cavity in such a manner that when the two dies compress on the deformable sheet 610, a projection nests within a corresponding opposite cavity while it is deforming the deformable sheet in-between so as to shape it substantially according to the shape of the projection-cavity nested pair.

As the dies 620 and 630 are compressed together, the projections 621, 631 of the dies "punch through" and extrude the deformable sheet 610 to create the raised features, together with the corresponding opening on each raised feature, on deformable sheet 610, thereby producing the interface structure 100 as illustrated in FIG. 2.

This manufacturing process not only facilitates the production of desirable interface material geometries, but also it is amenable to high-volume, low-cost fabrication of the interface structure.

The dies 620 and 630 may be fabricated from a range of materials using various manufacturing techniques known by those skilled in the related art. For example the dies shown in the embodiment of FIG. 6 may be fabricated using a 3D printed polymer. Further detail related to the dies 620 and 630 is provided below with reference to FIG. 8.

Overall dimensions of the raised features such as height, aspect ratio, metal thickness and feature size or diameter can be designed to suit the specific application which may be determined by, but not limited to, the surface asperities at various length scales (ranging from micro roughness to waviness or larger errors in form) and available assembly pressure. The resulting geometries of the raised features may therefore depend on the geometries of the dies and initial thickness of the deformable sheet, which may vary according to the specific requirements of each design and application.

Some materials suitable for the interface structure may include a range of malleable and conducting pure metals or alloys. One example is tin due to its low yield strength and reasonably high thermal and electrical conductivity. Depending on the application, assembly pressures or chemical considerations, stiffer, higher conductivity or chemically alternative metals or alloys may be desirable.

According to one example, applying pressure above 0.5 MPa, provides a structured tin interface material which may demonstrate relatively high effective thermal conductivity and low thermal resistance than a graphite pad.

Additionally, due to the large deformation range of this material, it may exhibit greater compliance over a range of pressures. Finally, due to the metallic nature of the tin interface material, it exhibits significantly lower electrical resistance. The aggregated effect of these factors results in significant performance improvements of the present embodiment using tin material for the interface structure material over some commercially available graphite pads.

After or before the process for forming the interface structure, the material of the interface structure may initially comprise one or more layers of additional material (in the form of a sandwich).

A further possibility is the use of overlaid material coatings to significantly alter the electrical, thermal and/or chemical response or performance of the interface material. Such coating may be primarily metallic, including but not limited to Gold (Au), Silver (Ag), Copper (Cu), Platinum (Pt), Palladium (Pa), Chrome (Cr), Zinc (Zn) Tin (Sn), Nickel (Ni) or Rhodium (Rh). The coating materials may be pure metals, metal oxides, or alloys containing a mixture of metallic materials, such as Gold Palladium. Preferably a soft metal may be coated with a conductive material (e.g. gold) that is resistant to oxidation and that lowers the electrical contact resistance between mating surfaces. For example, the effect of sputter coating an additional layer of gold on the above embodiment using tin material may offer significant decrease in the electrical resistance over an un-coated interface material. The addition of an alloying over-layer may serve to seal the surface from subsequent oxidation, allowing a longer service lifetime. In order to provide higher levels of compliance to the material of the interface structure, materials with higher levels of ductility may be used such as indium, tin, gallium or lead thereby increasing its capabilities in filling the gaps during compression and allowing it to form a tighter seal when bonded or compressed between layers in its application.

In this manner, the thermal and electrical properties of the overall TIM are enhanced.

In some embodiments, t may be desirable to limit the electrical conductivity while maintaining the thermal contact resistance. In such cases electrically insulative coatings such as polymers may be employed to obtain the desired result. Polymer materials are typically good electrical insulators and can be applied in thin, continuous coatings that are compliant. The dielectric coating could be applied either before or after stamping. Applying the coating before stamping is preferred as it may be easier and less expensive to achieve while a variety of coating techniques may be used. However, if it is desired to insure that all surfaces are insulated, the dielectric layer may preferably be applied after the stamping operation to insure that the exposed surface edges generated during compression and punching are coated. One example of an effective approach is to coat the punched film using the polymer Parylene. This polymer dielectric may be deposited from the gas phase insuring conformal coating of uniform thickness over all exposed surfaces. In order to perform the coating process, use may be made of commercially available coating equipment.

Such coatings may comprise just one additional layer, or several layers in a sandwich-type arrangement. The interfaces between the layers may be discrete and well-defined, or they may consist of inter-metallic layers with have a gradual change in the composition and morphology of the material.

The coatings may be applied by a number of methods including, but not limited to: in-situ chemical oxidation, by sputter coating using a DC current, by magneto-resistance, by electroplating or electroless plating in a plating bath, or by vapor deposition using metal organic pre-cursors, physical vapors or plasma enhanced methods.

The compressible solid interface structure may also be used in combination with an interpenetrating continuous phase of grease or adhesive to further improve the thermal, electrical or mechanical properties of the material upon compression. During compression, the raised features allow the flow of a fluid so as to fill gaps which may be formed during such compressions. For example, once compressed and the adhesive cured, the external clamping or assembly pressure may be removed and the thermal and electrical transport capabilities of the interface material would be maintained by the bonding effect of the adhesive.

As mentioned previously after the compression it may occur that not all the raised features actually close the respective opening, thereby leaving some areas on the structure with openings. This array of opening permits grease, or adhesive, to flow evenly between the upper and lower interfaces thereby eliminating trapped air and forming an interface with improved thermal performance and, in the case of the adhesive, improved mechanical bond strength.

Furthermore, the array of openings may also permit the grease or adhesive to flow between upper and lower surfaces of the interface structure forming a uniform thickness of material without significantly increasing the applied stress required for assembly.

Those skilled in the related art would appreciate that without the openings, air, grease or adhesive, or a combination of these materials could become trapped into pockets. These trapped pockets would increase thermal resistance and increase the required assembly pressure.

As mentioned above with reference to FIGS. 4A and 4B, the thickness of the walls of the raised features changes as one moves from the base portion to the end portion of the raised features. This effect may be achieved during the manufacturing process as a result of the action of the projections of the dies on the deformable sheet.

Figure 7A:
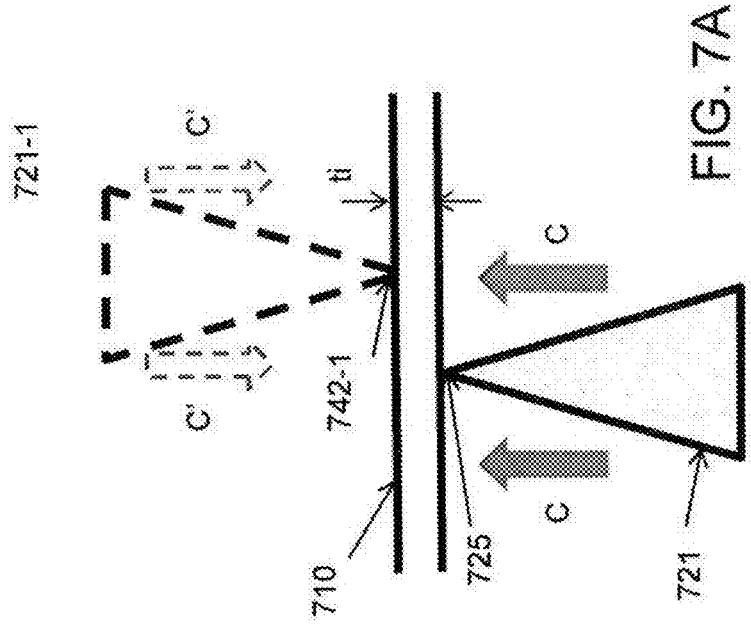
FIGS. 7A and 7B illustrate instance of producing raised features according to some embodiments.
Figure 7B:
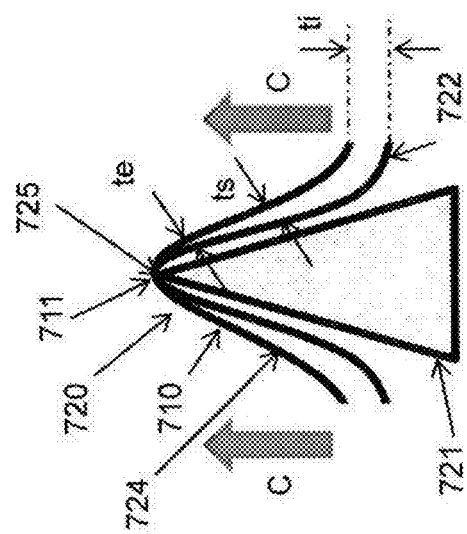

FIGS. 7A and 7B illustrates two instances of the compression process in which the above effect can be observed. Referring first to FIG. 7A, a portion of a deformable sheet 710 is shown in a first instance of entering into initial contact with the projections 721 and 721-1 of a die. It is understood that the deformable sheet 710 is in fact the substrate of the heat interface structure as already discussed above with reference to the previous figures.

Although not explicitly shown in the figure, projections 721 and 721-1 respectively form part of opposing dies similar to the arrangement shown in FIG. 6.

For simplicity, in the following, the action of projection 721 on the deformable sheet 710 is described as the former exerts a force on the latter in the direction of arrows C, while it is understood that a similar effect is produced as a result of the force exerted by projection 721-1 on the deformable sheet in the direction of arrows a which is opposite to the direction of arrow C.

It is assumed that at the initial instance of contact between the tip 725 of the projection 721 with the deformable sheet 710, the latter has an initial thickness ti.

Referring now to FIG. 7B, an instance is shown in which as a result of the force exerted by the projection 721 on the deformable sheet 710, the deformable sheet undergoes a deformation in the proximity of the point of contact between the tip 725 of the projection 721 and the deformable sheet. Such deformation is produced by stretching the deformable sheet, in the form of a material yield or flow caused in the deformable shield, in a direction parallel to arrows C thereby forming a raised feature 720 having a base portion 722, an end portion 711 and a wall 724. The result of such deformation, due to material yielding, is that the thickness of the wall 724 of the raised feature 720 decreases as one moves from the base portion 722 to the end portion 711 of the raised feature. Therefore, the thickness of a raised feature at said end portion te becomes smaller than a thickness ts of the raised feature at an intermediate portion of the raised feature.

As the force exerted by the projection 721 on the deformable sheet 710 continue to apply, an instance in arrived at which the deformable sheet fractures (not shown) in the vicinity of the point of contact between the tip 725 of the projection 721 and the deformable sheet, thereby producing an opening similar to those described with reference to FIGS. 2 to 6 such that the thickness of the raised feature at the end portion, where the opening is located, is smaller than a thickness of the raised feature at an intermediate portion of the raised feature.

As mentioned above, in some embodiments the raised features may comprise rough outer surfaces of the walls thereof. These rough outer surfaces may be manufactured using dies having corresponding rough, or otherwise uneven shapes.

Figure 8:
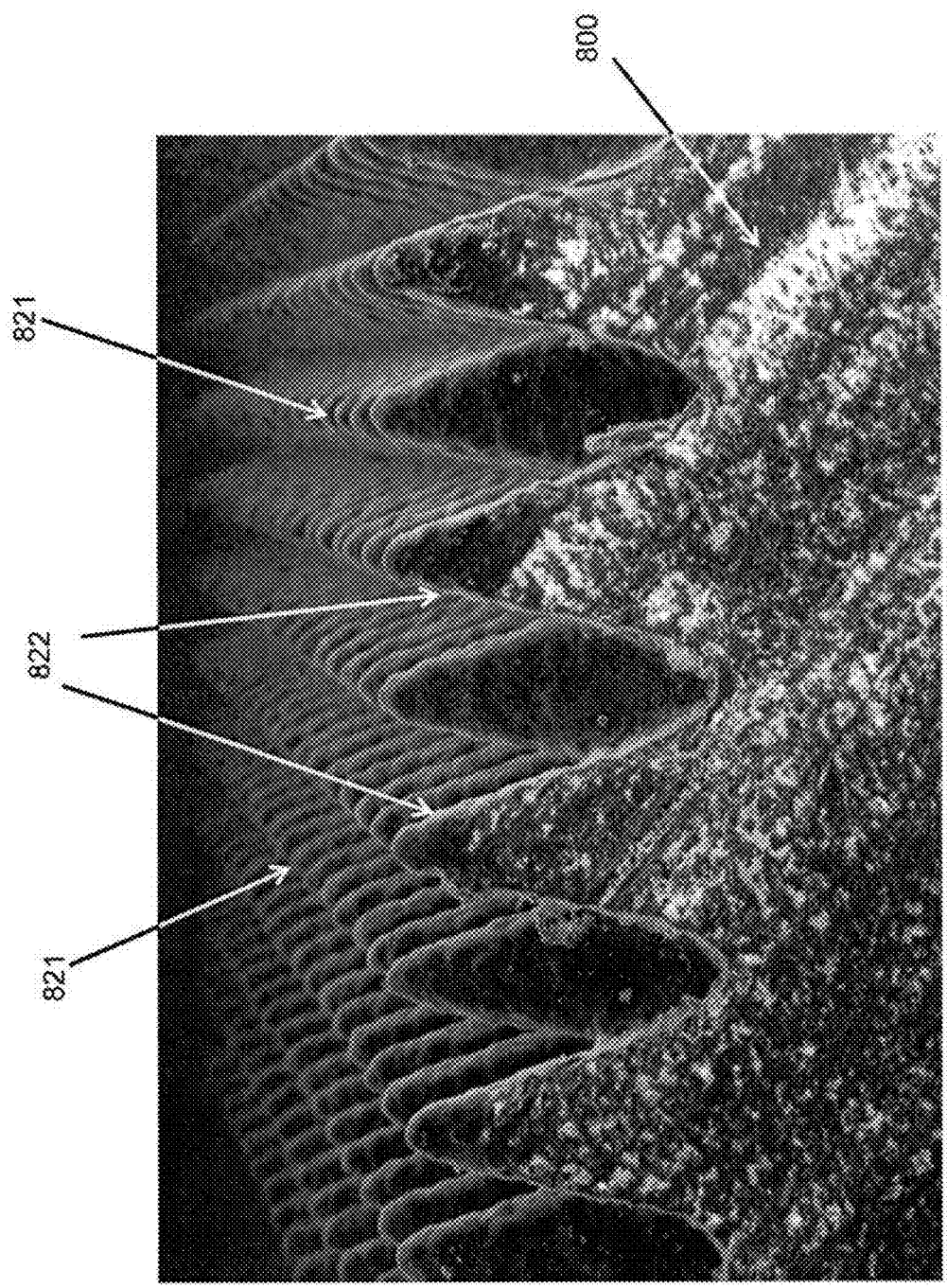
FIG. 8 is a top view of a portion of an exemplary die suitable for use in manufacturing operation of a heat transfer interface structure, according to some embodiments.

FIG. 8 is a side view photograph of a portion of an exemplary die suitable for use in manufacturing operation of a heat transfer interface structure, in which the die is designed to produce roughness on the outer surface of the raised feature during the manufacturing process. As can be seen in this figure, die 800 comprises projections 821 on a first side thereof (for simplicity only one side of the die is shown). Projection 821 is provided with a plurality of roughnesses on their outer surface. In FIG. 8 some roughnesses are shown in the form of bumps 822.

During the operation of stamping the interface structure (i.e. bringing the two opposite dies together with the interface positioned between them), the rough surfaces on the projections 821 transfer the unevenness associated to the roughness thereon to the surface of the raised features as they are formed.

In this manner, raised features are produced having roughnesses on their outer surface.

The proposed solution therefore offers improved thermal and electrical performance over conventional interface materials. Additionally, the manufacturing technique described herein is a low-cost alternative to conventional interface techniques. The addition of alternative metallic coatings to the interface material further improves its electrical properties making it a desirable solution for thermal and electrical interface applications.

The various embodiments of the present disclosure may be combined as long as such combination is compatible and/or complimentary.

Further it is to be noted that the list of structures corresponding to the claimed means is not exhaustive and that one skilled in the art understands that equivalent structures can be substituted for the recited structure without departing from the scope of the disclosure.

It is also to be noted that the order of the steps of the method of the invention as described and recited in the corresponding claims is not limited to the order as presented and described and may vary without departing from the scope of the disclosure.

It should be appreciated by those skilled in the art that any block diagrams herein represent conceptual views of illustrative circuitry embodying the principles of the disclosure.

The invention claimed is:

1. A thermally conductive heat transfer interface structure comprising a substrate having a first surface and a second surface and a plurality of raised features formed on at least one of the first surface and the second surface of the substrate, the raised features being deformable under a compressive force, wherein at least some of the raised features each have an opening through a respective end portion thereof;
  wherein a thickness of a wall of a raised feature of the at least some of the raised features at said end portion is smaller than a thickness of the wall of the raised feature at an intermediate portion of the raised feature; and
  wherein, one or more raised features from the plurality of the raised features each comprise a first height corresponding to a first location on the end portion thereof and a second height corresponding to a second location on the end portion thereof, wherein each one of the first height and the second height is a distance from a plane defined by the substrate to a parallel plane passing through a location on the end portion.

2. A thermally conductive heat transfer interface structure comprising a substrate having a first surface and a second surface and a plurality of raised features formed on at least one of the first surface and the second surface of the substrate, the raised features being deformable under a compressive force, wherein at least some of the raised features each have an opening through a respective end portion thereof;
  wherein a thickness of a wall of a raised feature of the at least some of the raised features at said end portion is smaller than a thickness of the wall of the raised feature at an intermediate portion of the raised feature; and
  wherein the wall of the raised feature from the plurality of the raised features has roughness on an outer surface thereof.

3. A method, comprising:
  placing a deformable sheet of thermally conductive material between two dies each comprising at least one of a projection and a cavity on a respective surface of each die, wherein the at least one projection has a matching shape and dimensions with the at least one cavity;
  moving a die from the two dies toward the other such that the at least one projection nests within a corresponding opposite cavity of the other of the two dies and such that a compressive force is applied to the deformable sheet located between the projection and the cavity to produce a raised feature in the deformable sheet, the raised feature having an opening through a respective end portion thereof; and
  wherein a thickness of a wall of a raised feature of the at least some of the raised features at said end portion is smaller than a thickness of the wall of the raised feature at an intermediate portion of the raised feature.

4. The method of claim 3, comprising:
  exerting the compressive force by the at least one projection on the deformable sheet, causing the deformable sheet to undergo a deformation in the proximity of a point of contact between the projection and the deformable sheet, wherein
  said deformation is produced by causing a material yield in the deformable sheet at said point of contact to cause the thickness of the wall of the raised feature at said end portion become smaller than the thickness of the wall of the raised feature at the intermediate portion of the raised feature.

5. The method of claim 4, further comprising fracturing the deformable sheet to produce the opening in the end portion of the raised feature.

6. The method of claim 3, wherein the dies have roughness on at least one respective outer surface thereof, such roughness being configured to transfer unevenness associated to the roughness thereon to a surface of the raised features as the deformable sheet is deformed.

7. An apparatus comprising:
  an electronic component capable of generating heat in response to being put in operation;
  a heat dissipater; and
  a thermally conductive heat transfer interface structure comprising a substrate having a first surface and a second surface and a plurality of raised features formed on at least one of the first surface and the second surface of the substrate, the raised features being deformable under a compressive force, wherein some of the raised features each have an opening through a respective end portion thereof;
  wherein a thickness of a wall of a raised feature of the at least some of the raised features at said end portion is smaller than a thickness of the wall of the raised feature at an intermediate portion of the raised feature; and
  wherein said heat transfer interfaced structure is located between the electronic component and the heat dissipater;
  wherein one or more raised features from the plurality of the raised features each comprise a first height corresponding to a first location on the end portion thereof and a second height corresponding to a second location on the end portion thereof, wherein each one of the first height and the second height is a distance from a plane defined by the substrate to a parallel plane passing through a location on the end portion.

* * * * *